US007937634B2

(12) United States Patent
Almukhaizim et al.

(10) Patent No.: US 7,937,634 B2
(45) Date of Patent: May 3, 2011

(54) CIRCUIT AND METHOD PROVIDING DYNAMIC SCAN CHAIN PARTITIONING

(76) Inventors: Sobeeh A. Almukhaizim, Kuwait (KW); Ozgur Sinanoglu, Kuwait (KW)

( * ) Notice: Subject to any disclaimer, the term of this patent is extended or adjusted under 35 U.S.C. 154(b) by 262 days.

(21) Appl. No.: 12/379,246

(22) Filed: Feb. 17, 2009

(65) Prior Publication Data

US 2010/0211839 A1   Aug. 19, 2010

(51) Int. Cl.
*G01R 31/28* (2006.01)
(52) U.S. Cl. ......... 714/726; 714/727; 714/729; 714/731
(58) Field of Classification Search .................. None
See application file for complete search history.

(56) References Cited

U.S. PATENT DOCUMENTS

| | | | |
|---|---|---|---|
| 5,634,001 A | 5/1997 | Mittl | |
| 7,249,298 B2 * | 7/2007 | Sim | 714/726 |
| 7,555,688 B2 * | 6/2009 | Alvamani et al. | 714/729 |
| 2005/0010832 A1 * | 1/2005 | Caswell et al. | 713/330 |
| 2006/0095818 A1 * | 5/2006 | Bratt et al. | 714/726 |
| 2006/0236176 A1 * | 10/2006 | Alyamani et al. | 714/726 |
| 2007/0162805 A1 | 7/2007 | Saxena et al. | |
| 2007/0260952 A1 * | 11/2007 | Devanathan et al. | 714/726 |
| 2008/0071513 A1 | 3/2008 | Chickermane et al. | |
| 2008/0222471 A1 * | 9/2008 | Sul et al. | 714/731 |
| 2009/0228751 A1 * | 9/2009 | Gloekler et al. | 714/728 |

OTHER PUBLICATIONS

Myung-Hoon Yang ; Taejin Kim ; Yongjoon Kim ; Sungho Kang ; Segmented scan architecture using segment grouping for test cost reduction, Issue Date : Nov. 24-25, 2008, International SoC Design Conference, 2008. ISOCC '08.*

* cited by examiner

*Primary Examiner* — Jeffrey A Gaffin
*Assistant Examiner* — Guerrier Merant
(74) *Attorney, Agent, or Firm* — Richard C. Litman

(57) ABSTRACT

The circuit and method providing dynamic scan chain partitioning delivers peak power reduction by dynamically partitioning scan chains into multiple groups, wherein transitions are equally distributed among these multiple groups. For each test pattern, a particular partitioning that leads to the even partitioning of the transitions is computed by analyzing the transition distribution of the pattern. The scan chain partitioning is formulated using an Integer Linear Programming (ILP) and an efficient greedy heuristic. The computed information is loaded into the reconfigurable scan chain partitioning hardware during the capture window. The partitioning hardware is composed of controllable clock gating logic, which is reconfigured on a per pattern basis, wherein the reconfiguration is effected by only utilizing the existing scan channels. The reconfigurability delivers a solution that is test set independent. The results confirm the superiority of dynamic scan chain partitioning over static partitioning techniques in terms of peak power reduction.

12 Claims, 9 Drawing Sheets

| SCAN ARCH. | PROB(1)=0.10 | | | | PROB(1)=0.30 | | | | PROB(1)=0.50 | | | |
|---|---|---|---|---|---|---|---|---|---|---|---|---|
| | ILP | | GREEDY | | ILP | | GREEDY | | ILP | | GREEDY | |
| | POWER | TIME | POWER | TIME | POWER | TIME | POWER | TIME | POWER | TIME | POWER | TIME |
| 20 x 50 | 53 | <1 | 54 | <1 | 126 | <1 | 133 | <1 | 150 | <1 | 164 | <1 |
| 50 x 100 | 312 | 3 | 328 | <1 | 731 | 7 | 748 | <1 | 864 | 7 | 873 | <1 |
| 50 x 500 | 1383 | 3989 | 1427 | <1 | NA | NA | 3200 | <1 | NA | NA | 3759 | <1 |

Fig. 6

| CIRCUIT NAME | AREA OVERHEAD | | |
|---|---|---|---|
| | 2 GROUPS | 4 GROUPS | 8 GROUPS |
| s13207 | 2.6% | 6.6% | 13.2% |
| s15850 | 2.5% | 6.4% | 12.8% |
| s35932 | 0.8% | 2.1% | 4.1% |
| s38417 | 0.9% | 2.4% | 4.8% |
| s38584 | 0.9% | 2.2% | 4.4% |

*Fig. 9*

CIRCUIT AND METHOD PROVIDING DYNAMIC SCAN CHAIN PARTITIONING

BACKGROUND OF THE INVENTION

1. Field of the Invention

The present invention relates to integrated circuit chip testing procedures, and particularly to a circuit and method providing dynamic scan chain partitioning to reduce power during chip testing.

2. Description of the Related Art

Scan-based testing has become the standard in testing VLSI circuits due to the enhanced controllability and observability it provides. High fault coverage levels can be attained by serially inserting the test stimulus into the scan chains through the scan-in pins, by applying it to the circuit, and by serially collecting the responses through the scan-out pins. Enhanced accessability, however, is reaped at the expense of increased switching activity. During the shift cycles, any scan cell may potentially toggle. Furthermore, the transitions that stem from the toggling scan cells propagate into the combinational logic being tested, triggering more transitions there. As a result, scan-based testing suffers from elevated power dissipation.

The total switching activity generated throughout the test process constitutes the energy. Average power is the ratio of energy to the duration of the complete test process. High average power during testing leads to the overheating of the chip and, thus, endangers its reliability. Instantaneous power, on the other hand, is the value of power dissipation at a given point in time, while peak power is defined by the maximum instantaneous power. In computing the peak power, the time instants wherein toggling occurs is of particular focus; for positive-edge flip-flops, these time instants are marked by the rising edges of the clock. Excessive peak power levels, especially levels beyond which the chip can functionally operate at, may lead to an unexpected behavior of the circuit. Consequently, observed responses differ from the expected ones, resulting in a yield loss. While average power can be reduced by slowing down the shift clock, and thus suffering from prolonged test application time, even such an approach is of no remedy for peak power.

Power dissipation can be decomposed into three components. The first component is the power dissipation within the scan chains, while the second component is the power dissipation within the combinational logic as a consequence of the toggling of the scan cells. The third component is the power dissipated within the clock tree, which is due to the toggling of the clock lines that feed the scan path. Clock power dissipation has been shown to be the major contributor of test power and thus needs to be handled in addition to the power dissipation of the scan path and the combinational logic.

A solution that targets the reduction of all three contributing factors of test power is scan chain partitioning. In such a scheme, only a subset of the scan chains may be toggling at any instance, while all the remaining chains preserve their content. This can be attained by manipulating the test clock of the scan chains. The clock network, the scan path, and the combinational logic associated with the non-toggling scan chains do not dissipate any power, as they are all idle. The power reduction level is determined by the amount of switching activity that occurs in the toggling part of the design.

Peak power, by definition, is dictated by one cycle of one test pattern (excluding the possibility of transition-wise ties among different cycles) wherein the highest level of toggling occurs. Thus, peak power reduction necessitates the special handling of this problematic test pattern. Ideally, the chains should be partitioned in such a way that the transitions of this pattern are evenly distributed over multiple time instants within the shift cycle, maximally reducing the peak power. Static partitioning of the scan chains, namely, the identical partitioning of chains for all the test patterns, may fail to deliver this special handling for the problematic pattern; highly toggling chains may be grouped together within the same partition, failing to deliver a significant peak power reduction. To minimize peak power, scan chain partitioning can be customized based on a given test set. However, a single partitioning may be incapable of evenly distributing the transitions of all the problematic patterns. Furthermore, such a test set dependent solution would fail to comply with the standard industrial design flow, as a slight change in the design leads to the re-generation of test patterns, enforcing a costly, if feasible, re-synthesis of the clock network.

Instead, a dynamic and test set independent scan chain partitioning technique that is capable of adapting to the transition distribution of any test pattern is the key to minimizing peak power. A solution that is capable of effecting the chain partitioning on a per pattern basis can be pursued in order to evenly distribute the transitions of any test pattern, adaptively providing the special handling needed for any problematic pattern.

Numerous methodologies that aim at test power reduction in a scan-based environment have been proposed recently. The utilization of externally controlled gates or modified scan cell designs has been shown to reduce test power drastically, albeit at the expense of functional performance degradation due to the additional gate delays introduced on functional paths. Appropriate primary input assignments during the shift cycles help reduce transition propagation from the scan chain to the circuit under test; however, the effectiveness of such techniques is limited as circuits are typically controlled by scan chains rather than primary inputs. Test vector ordering and scan-latch clustering/ordering techniques, modification of test cube compaction and test generation and don't care bit specification procedures constitute a set of alternative techniques for reducing scan power dissipation. However, all of the previous techniques extract test power reductions at the expense of performance degradation, possible layout constraint violations, or prolonged test application time. Furthermore, none of these techniques alleviate the power dissipation problem in the clock network.

A number of scan chain modification techniques for test power reduction have been proposed. These techniques essentially rely on scan chain modifications, which are effected based on the analysis of a test set, in order to transform the test vectors and responses into new stimuli and response vectors with fewer transitions. While significant test power reductions are thus attained, these techniques are test set dependent, and are thus more suitable for application in the core-based SOC domain. Furthermore, clock power dissipation is not reduced by these techniques.

Various other techniques have also been proposed to reduce peak power. The peak power minimization problem is attacked by classifying clock cycles in which peak power violation occurs; bit-stripping and, subsequently, re-specifying the don't care bits are performed in order to reduce the transitions below a given threshold in the problematic cycles. The necessity to manipulate the test patterns is the major drawback in these techniques.

In fact, a closer look into the IR-drop issue and the consequent peak power violations are provided in a test pattern scrubbing technique and various don't care bit specification techniques. However, in these techniques power dissipation in the clock network is not alleviated, because with the shift clock spreading technique, instantaneous power will only be reduced by an offset between the rising edges of the shift clock. In other words, the shift clock that feeds a scan cell ripples through other scan cells prior to reaching this scan cell. To attain both clock power and logic power reduction, however, the scan cell design has to be modified. Furthermore, the shift frequency may have to be reduced in order to account for the rippling of the shift clock through the entire scan chain. Thus, deeper scan chains limit the applicability of this approach.

Scan chain partitioning techniques have also been proposed for test power reduction, wherein the scan chain is decomposed into several partitions so as to have only one of the partitions active at a time during shift mode, during capture mode, or during both shift and capture modes reducing scan chain toggling. The main advantage of these techniques is the fact that they are test set independent and that they can reduce power dissipation in the clock tree also. All these techniques constitute static scan chain partitioning, wherein a single scan chain partitioning is pursued for all the test patterns. While these scan chain segmentation techniques provide reasonable average test power reductions, their effectiveness in reducing peak power may be limited depending on the distribution of transitions for a particular test pattern, which dictates the peak power within the statically constructed partitions.

Thus, a circuit and method providing dynamic scan chain partitioning solving the aforementioned problems are desired.

SUMMARY OF THE INVENTION

The circuit providing dynamic scan chain partitioning includes a partitioning block inserted into a scan chain architecture. The scan chain architecture has a plurality of scan chains, each of the scan chains having a scan chain clock. The partitioning block manipulates the scan chain clocks feeding scan chains, and partitions the scan chains into groups to minimize peak power. Thus, the partitioning block is reconfigurable on a per test pattern per scan chain basis.

The partitioning block has a partition register containing a plurality of flip-flops for each of the scan chains, as well as a clock generator block for feeding the partition register. The partitioning block includes a plurality of AND gates connected to the flip-flops and a plurality of multiplexers connected to the plurality of AND gates. The plurality of multiplexers selects one of the signals as a clock signal for the corresponding scan chain. A delay for each clock signal is adjusted in order to stagger clock edges within a shift cycle.

Partitioning register is loaded with control data during the capture window through scan-in channels. The control data is precomputed by software, and dictates the partitioning of the scan chains. The software-based precomputation of control data aims at minimizing peak power during testing.

During the functional mode, the multiplexers are forced to select the original clock. All of the functional flip-flops in the design receive an identical clock signal during the functional mode and during the capture window.

These and other features of the present invention will become readily apparent upon further review of the following specification and drawings.

BRIEF DESCRIPTION OF THE DRAWINGS

FIG. 6 is a table showing comparison of ILP solver and greedy heuristic for a single pattern and two groups in a method providing dynamic scan chain partitioning according to the present invention.

FIG. 9 is a table showing area overhead in a circuit and method providing dynamic scan chain partitioning according to the present invention.

Similar reference characters denote corresponding features consistently throughout the attached drawings.

DETAILED DESCRIPTION OF THE PREFERRED EMBODIMENTS

Figure 1:
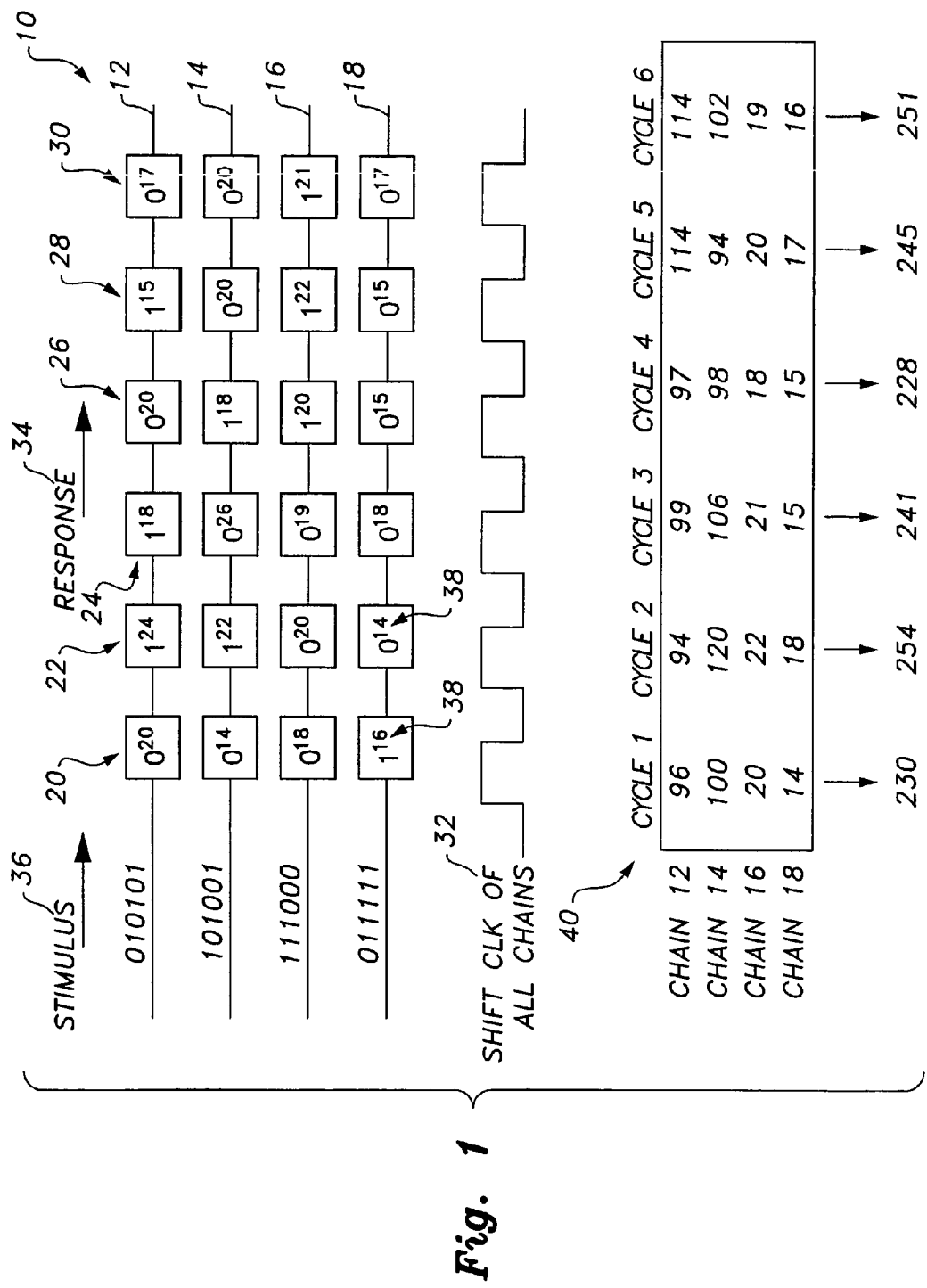
FIG. 1 is a chart showing an exemplary scan chain test pattern and its cycle-by-cycle transition distribution without applying any scan chain partitioning according to the present invention.

In FIG. 1, an exemplary scan test architecture, generally indicated by the number 10, for an integrated circuit chip is shown. The scan test architecture 10 shows four scan chains 12, 14, 16, 18, each with six scan cells, 20, 22, 24, 26, 28, 30. No scan chain partitioning is pursued in this example. All scan chains 12, 14, 16, 18 receive an identical shift clock 32. A captured response 34 and a subsequent stimulus 36 to be inserted are shown. A weight 38 is assigned to each of the cells 20, 22, 24, 26, 28 and is displayed in the upper right corner of each of the cell.

On the bottom of FIG. 1, a cycle-by-cycle transition count chart, generally indicated by the number 40, for each of the scan chains 12, 14, 16, 18 is also shown. For instance, in the topmost scan chain, denoted as chain 12, all the scan cells 20, 22, 24, 26, 28, 30 except for the third one, scan cell 24, toggle in the first shift cycle, resulting in 20+24+20+15+17=96 transitions in this cycle. For every shift cycle, the total number of transitions in all four scan chains is provided. Peak power, considering only this pattern, is the maximum value among these six cycles, which happens to be 254, occurring during Cycle 2.

Figure 2:
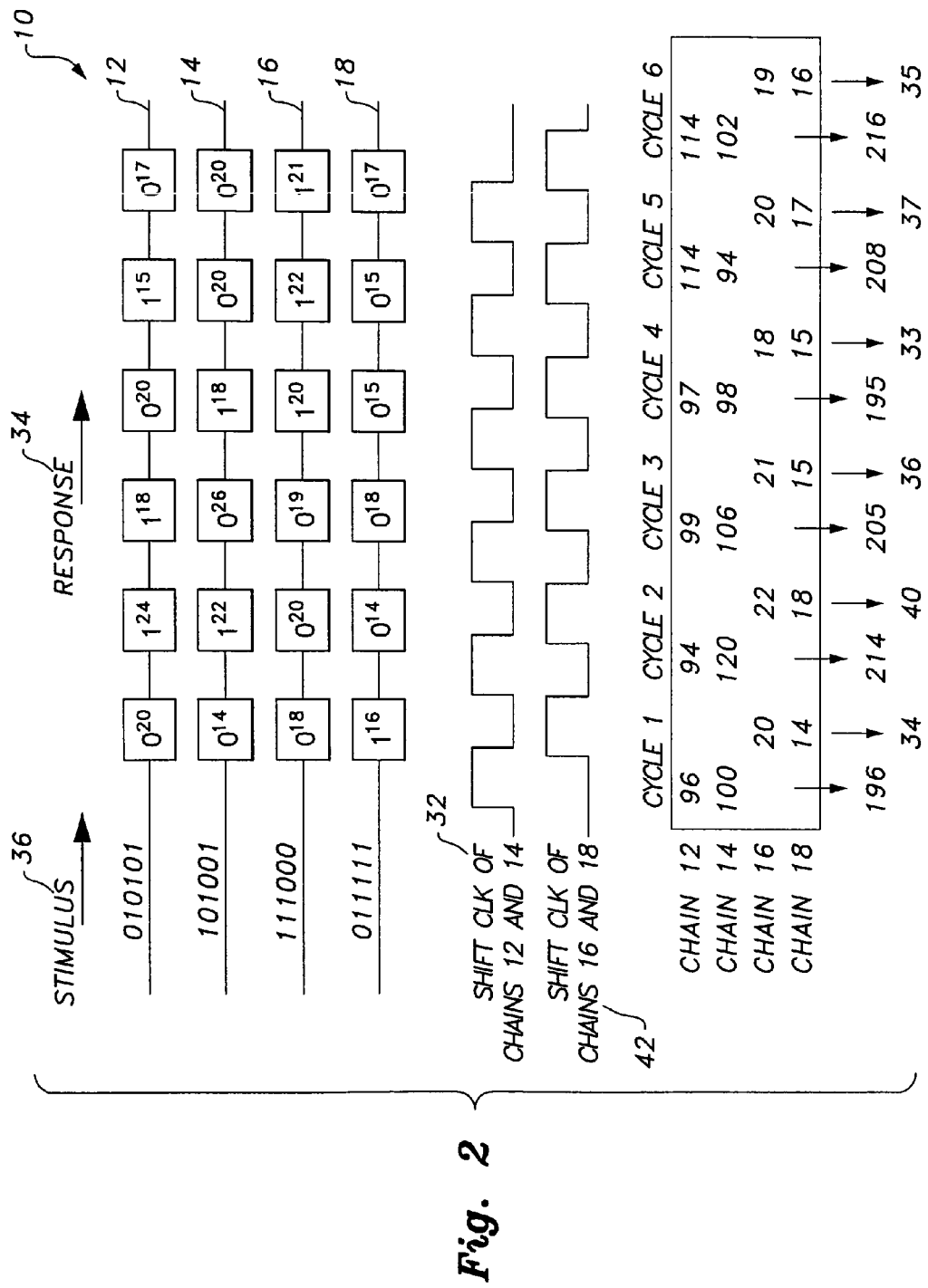
FIG. 2 is a chart showing the exemplary scan chain test pattern of FIG. 1 and its cycle-by-cycle transition distribution with static scan chain partitioning being applied, the first and second chains receiving a first clock signal and the third and fourth chains receiving a second clock signal.

In FIG. 2, a static partitioning is considered of the scan chains 12, 14, 16, 18 into two groups, wherein the top two chains 12, 14 constitute one group, and the bottom two chains 16, 18 constitute the other group for the same example in FIG. 1. The top two chains 12, 14 receive the shift clock 32, while the bottom two chains 16, 18 receive another shift clock 42, which is delayed by one-half a clock period compared to the former clock 32.

As a result, peak power is distributed within the shift cycles. Only two chains have the potential to toggle at any instant of time during shift cycles. In this case, shifting occurs twice within every shift cycle, once at the rising edge of the first shift clock 32, and once at the rising edge of the second shift clock 42. Thus, scan chain transitions are reported for twelve time instants throughout these six cycles. The peak power is reduced from 254 down to 216 (during Cycle 6) as a result of the static partitioning. The partitioning illustrated in FIG. 2 is actually the worst possible partitioning among all possible partitioning scenarios of the four chains 12, 14, 16, 18 into two groups.

Figure 3:
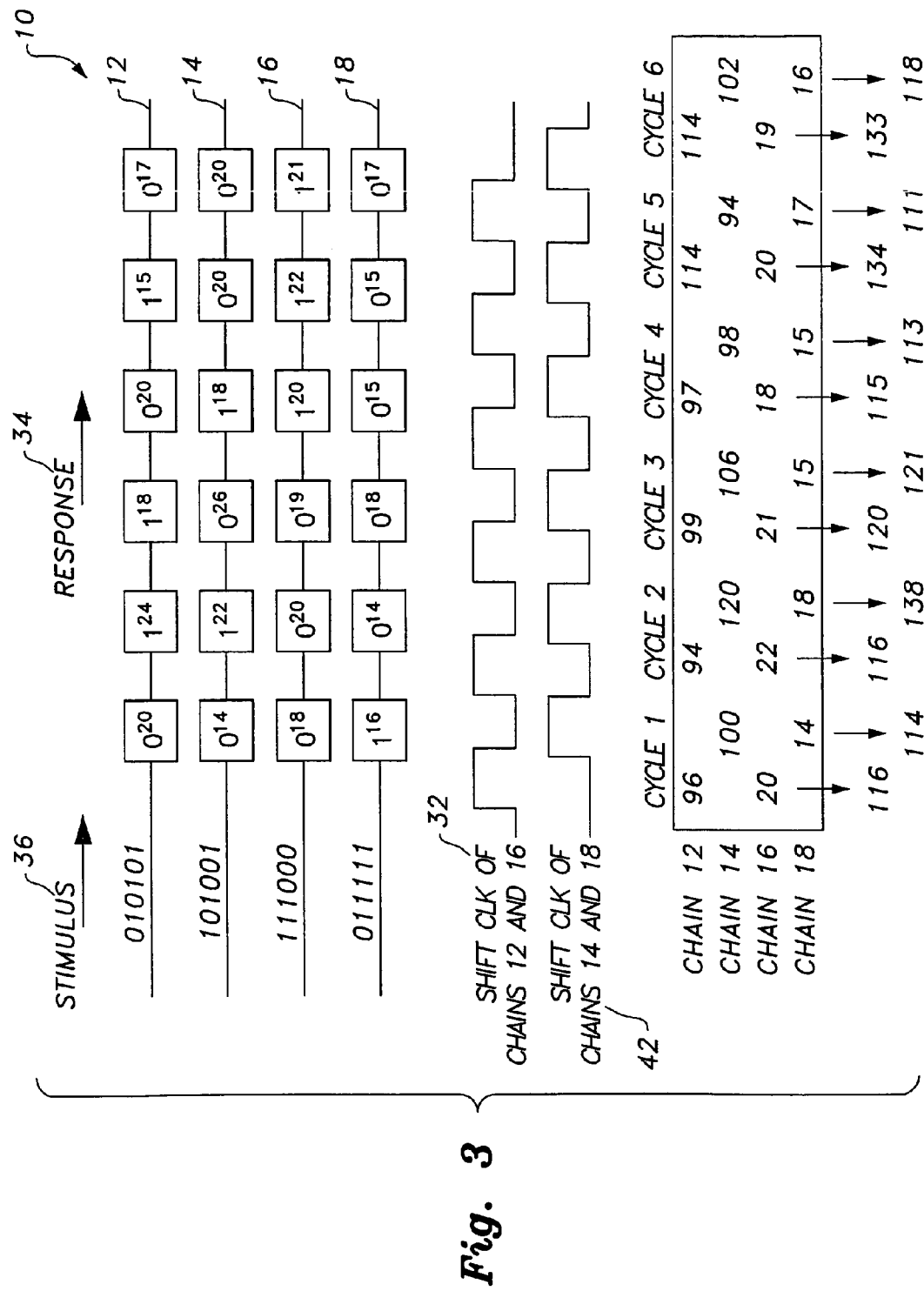
FIG. 3 is a chart showing the exemplary scan chain test pattern of FIG. 1 and its cycle-by-cycle transition distribution with static scan chain partitioning being applied, the first and third chains receiving a first clock signal and the second and fourth chains receiving a second clock signal.

The best possible partitioning for any pattern is one that distributes the scan chain transitions as evenly as possible, as illustrated in FIG. 3. In this particular partitioning, the first and the third chains 12, 16 constitute one group while the second and the fourth chains 14, 18 form the other group. It can be seen that such a partitioning reduces peak power down to 138 (in Cycle 2). Such a significant level of reduction is reaped due to the even distribution of scan chain transitions between the two partitions. The theoretical best that can be attained is one-half of the original peak power, when the chains are partitioned into two groups only. In general, a peak power reduction factor of up to P can be expected when the chains are partitioned into P groups.

As the best possible partitioning may vary from one pattern to another, and as any one of the patterns may be the problematic one that dictates the peak power, a dynamic partitioning solution is desirable. In such a solution, the best possible partitioning is selected for every pattern, limiting the peak power. For the example test pattern illustrated in FIG. 1, the dynamic partitioning technique would implement the particular partitioning in FIG. 3 for this pattern, while it is able to effect another partitioning for another test pattern.

Figure 4:
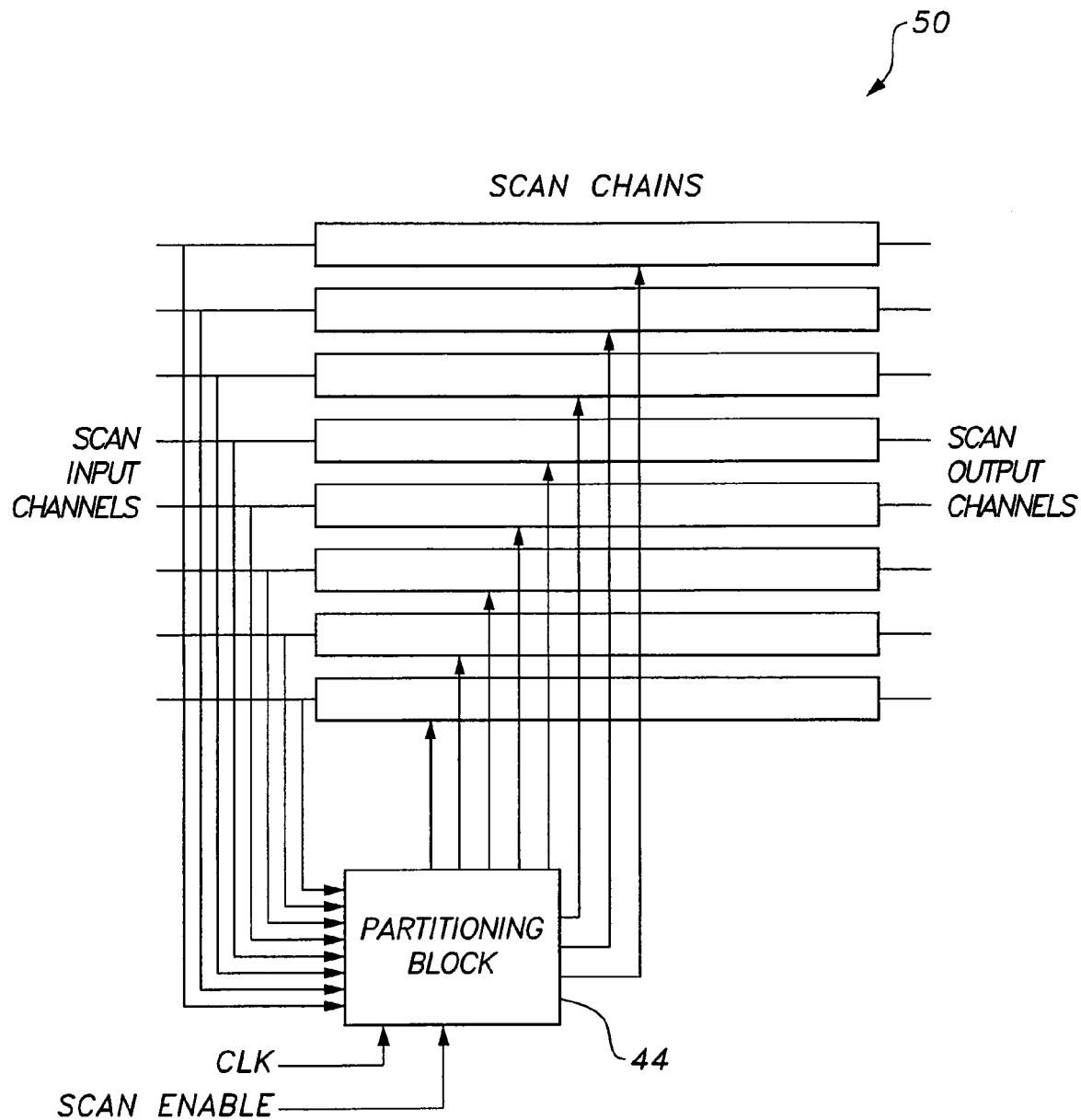
FIG. 4 is a schematic diagram showing a partitioning block inserted into a conventional scan architecture to obtain dynamic scan chain partitioning according to the present invention.

In order to implement dynamic scan chain partitioning, a partitioning block 44 is inserted into the scan chain architecture 50, as shown in FIG. 4. The only parameters required to design this block 44 are the number of scan chains and the number of partitions. As FIG. 4 illustrates, the partitioning block 44 manipulates the clocks that feed scan chains. The application of the technique using the partitioning block 44 is illustrated on a single clock domain design in order to simplify the discussion. However, in the presence of a plurality of clock domains, the scan chains of each domain should be handled individually, and the same hardware is utilized at no additional cost.

As every test pattern may potentially necessitate a distinct scan chain partitioning, the partitioning block should be reconfigured on a per test pattern basis. Also, depending on the particular distribution of scan chain transitions, the best possible partitioning of scan chains into groups should be effected in order to minimize peak power. Thus, the partitioning block 44 is reconfigurable on a per test pattern per scan chain basis.

Figure 5:
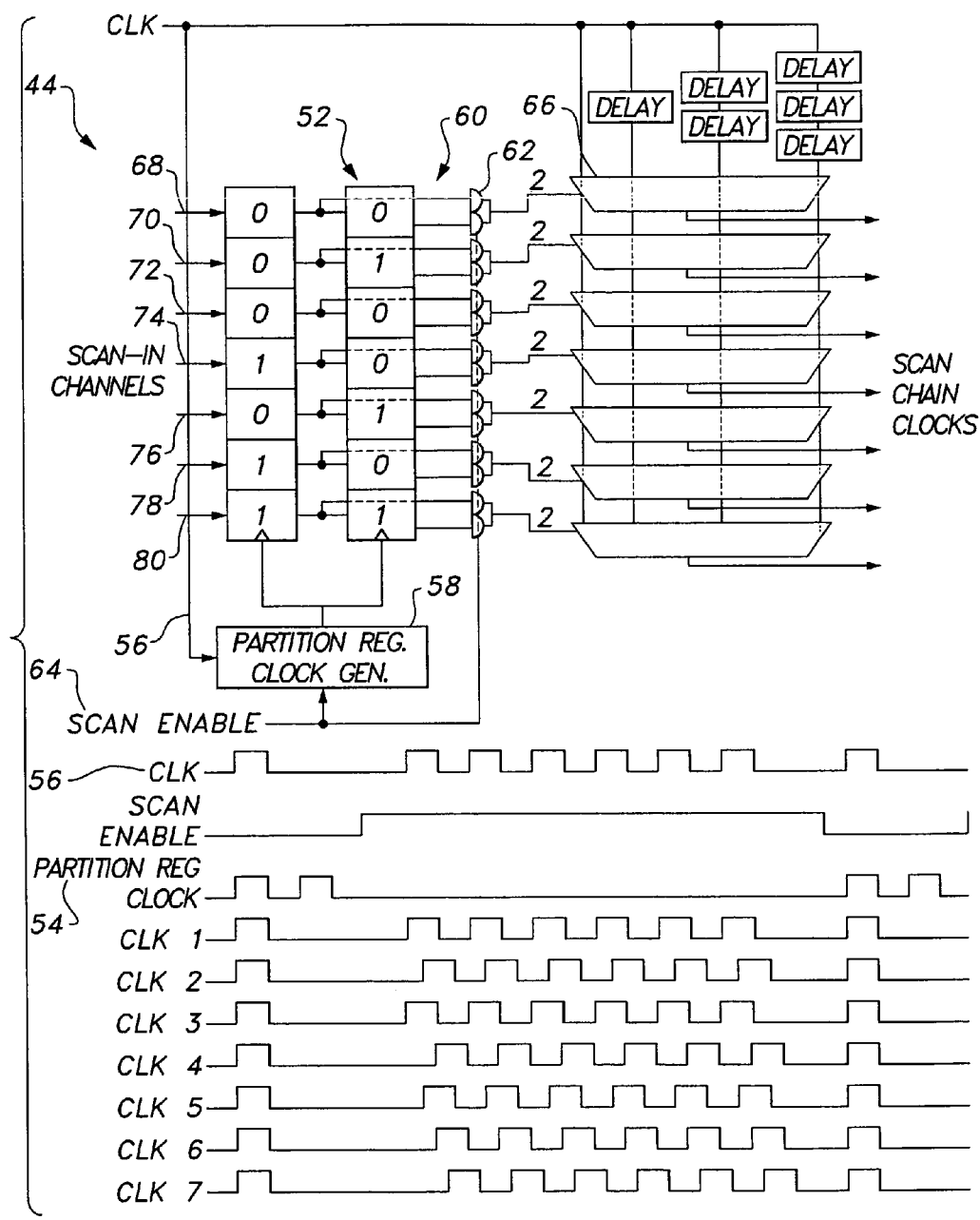
FIG. 5 is a chart showing partitioning block implementation and clock signal manipulation in a circuit providing dynamic scan chain partitioning according to the present invention.

The implementation of the partitioning block 44 is shown in FIG. 5. The block 44 includes a partition register, generally indicated with the number 52, that contains $[\log_2(P)]$ flip-flops for each scan chain, where P denotes the number of scan chain groups. A clock signal that feeds the partition register 52 is generated out of the original clock signal "clk" 56 by a clock generator block 58. All the flip-flop outputs 60 are ANDed 62 with a scan enable signal 64, and the AND gates 62 outputs control the select signals of multiplexers 66. The multiplexers 66 take P inputs, which are the original "clk" signal 56 and its delayed versions, and select one of the P signals as a clock signal for the corresponding scan chain. The delay magnitude for each delayed clock signal is properly adjusted in order to stagger the P active clock edges as widely as possible within a shift cycle.

In conventional scan testing, the scan-in channels are unused during the capture window. In the capture window, the scan cells capture the response of the circuit under test. Even if the same functional pins are re-used as scan-in channels, a boundary scan is employed, which enables control of the combinational logic via scan registers rather than the primary inputs directly, and thus eliminating the need to control primary inputs during capture cycle. As these channels are idle and are thus available during the capture window, the channels are used to perform $[\log_2(P)]$ load operations in order to set the partition register 52. The load operations may not fit within the capture window, depending upon its width, in which case the capture window is expanded.

It should be noted, however, that the partition register 52 load operation within the capture window can be applied at a much faster frequency than regular shift operations. The frequency of shift operations is typically limited due to power dissipation issues. However, load operations of the partition register 52 consume negligible power, as toggling is constrained within the partition block only. Hence, the load operation of the partition register 52 within the capture window can be applied at a much faster frequency, as power dissipation is not a limitation any longer. As a result, the capture window expansion can be alleviated or even eliminated, rendering test time penalty quite negligible. The particular case of partitioning into two groups can be effected with no increase in test time, as $[\log_2(P)]$ equals to one and, thus, the single cycle load operation of the partition register 52 can be effected concurrently with the functional register capture operation.

The content of the partition register 52 is preserved throughout the shift cycles until the next capture window. This is insured by disabling the clock signal feeding the partition register 52 throughout the shift cycles. The AND gates 62 that control the multiplexers 66 select lines serve the following purpose. When the scan enable is 0, namely, during the functional mode or the capture window, all of the multiplexers 66 are forced to select the original clock 56. Thus, all the functional flip-flops receive an identical clock signal during the functional mode and during the capture window. During the shift cycles, on the other hand, the partition register 52 content dictates whether the original clock or one of its delayed versions is to be selected. For each scan chain, $[\log_2(P)]$ bits are reserved in the partition register 52. By loading the partition register 52 with a proper sequence of bits, any possible partitioning of the scan chains into P groups can be effected. Furthermore, partitioning can be effected on a per pattern basis.

An example chain clock generation is also provided in FIG. 5, wherein the clocks of seven scan chains 68, 70, 72, 74, 76, 78, 80 are partitioned into four groups. In this example, the first and the third chains 68, 72, the second and the fifth chains 70, 76, the fourth and the sixth chains 74, 78, and the seventh chain 80 alone form the four groups. In this example, the delay of each partition shift clock is adjusted so that the phases of the four partition shift clocks are 90° apart.

In at-speed launch-off-shift testing, the early update of some of the scan chains 68, 70, 72, 74, 76, 78, 80 necessitates that at-speed transitions be launched from the chains 68, 70, 72, 74, 76, 78, 80 that are updated in the latest time instant of the last shift cycle, potentially resulting in test pattern count increase and/or at-speed coverage loss. Launch-off-capture scheme, on the other hand, can be applied intact with the scan architecture 50, as capture clocks remain intact.

The area cost of the proposed technique roughly consists of [$\log_2(P)$] flip-flops, [$\log_2(P)$] AND gates, and one P-by-1 multiplexer per scan chain, in addition to the area cost of the partition register clock generator block 58, which is negligible for industrial-size designs. The partitioning block hardware 44 is fixed for a given number of scan chains and groups. Thus, the partitioning block hardware 44 can be instantiated in the netlist whenever these factors are known or decided. Once the partitioning block 44 is inserted into the netlist, and the connections to this block 44 are made during the positional scan stitching phase, the subsequent clock tree synthesis step handles the balancing of the clocks in functional and in shift modes. However, additional effort may be necessary to balance the outputs of the clock multiplexers with respect to the clock, potentially requiring additional clock buffers, and the multiplexer outputs are treated as the clock sources for the corresponding functional registers in the design. Thus, this technique can be incorporated into conventional design flow with minimal effort.

The information to be loaded into the partition register 44 described above should be computed based on an analysis of the input stimulus 36 and the response 34 bits. Thus, the input to the analysis is an input stimulus 36 and response 34 bits. The target of this analysis is the derivation of which scan chains 68, 70, 72, 74, 76, 78, 80 to include in each partition to minimize peak power. The analysis is repeated for each input stimulus 36 and response 34 in order to dynamically partition the scan chains 68, 70, 72, 74, 76, 78, 80 for the entire test set.

At this point, the partitioning problem can be modeled into an Integer Linear Programming (ILP) formulation. Subsequently, a computationally-efficient greedy heuristic is provided. The purpose of both techniques is to identify the set of chains 68, 70, 72, 74, 76, 78, 80 to be included in the same partition in order to minimize the peak power incurred for a particular input stimulus 36 and response 34 bits. The ILP formulation defines the sequence of input stimulus 36 and response 34 bits for each chain 68, 70, 72, 74, 76, 78, 80, as follows:

$$\text{Sequence}[c] = (s_0^c, s_1^c, \ldots, s_{2n-1}^c)$$

where $0 \leq c \leq \text{num\_chains}$, the depth of the longest chain is n, and $S_i^j$ is the $i^{th}$ stimulus/response bit value in the $j^{th}$ chain.

Sequence [i] is a 1-dimensional binary array representing the next input stimulus and current response bits for chain i. The elements of this array follow the same ordering within the response and the stimulus patterns, wherein $s_0^j$ and $s_{n-1}^j$ denote the rightmost and the leftmost response bits, respectively, and $s_n^j$ and $s_{2n-1}^j$ denote the leading and the trailing stimulus bits, respectively, of chain j.

Since the objective of ILP formulation is to minimize the maximum number of transitions for a given shift cycle, the transitions are also defined in a given shift cycle as follows:

$$\text{Transition}[c] = (t_0^c, t_1^c, \ldots, t_{2n-2}^c)$$

where $t_i^c = s_i^c \oplus s_{i+1}^c$. Transition[i] is a 1-dimensional binary array that represents the transitions that will ripple through chain i for a test pattern. In order to account for the number of signals that may switch their logic value inside the logic cone for a transition in a particular scan cell, a weight 38 is assigned for the cell that corresponds to the total number of gates driven by that cell. More formally:

$$\text{Weight}[c] = (w_0^c, w_1^c, \ldots, w_{n-1}^c)$$

where $w_i^c$ is the total number of gates driven by scan cell i in chain c.

Next, the total number of transitions are defined for each chain 68, 70, 72, 74, 76, 78, 80 during every shift cycle as follows:

$$\text{Cycle}[c] = \left( \sum_{i=0}^{n-1} w_i^c t_i^c, \sum_{i=1}^{n} w_{i-1}^c t_i^c, \ldots, \sum_{i=n-1}^{2n-2} w_{i-(n-1)}^c t_i^c \right)$$

where Cycle[i] is a 1-dimensional array representing the number of transitions occurring in chain i for every shift cycle, similar to the cycle-by-cycle transition distribution illustrated in FIG. 1.

The next step is the definition of the solution variables. Every chain is assigned to one and only one of the P groups, where P is the number of time instances during the shift cycle. This is ensured by the first set of constraints:

$$p_{c,j} \leq 1; \text{ and } \sum_{j=0}^{P-1} p_{c,j} = 1$$

where $p_{c,j}$ is a binary variable that holds a value of 1 if chain c is included in partition j, j<P.

Next, we define variables $a_{\alpha,j}$ which represent the number of transitions in all chains during time instant j of shift cycle, $\alpha$, as follows:

$$a_{\alpha,j} = \sum_{c=0}^{\text{num\_chains}-1} p_{c,j} \times \text{Cycle}[c][\alpha]$$

where $0 \leq \alpha < n$. The last set of constrains defines variable Peak, which represents the maximum number of transitions in the P groups during all time instants for all shift cycles:

$$a_{\alpha,j} \leq \text{Peak}$$

where $0 \leq j < P$.

Finally, an optimization criterion can be simply defined as follows:

minimize Peak wherein the minimization of peak power over all time instants in all shift cycles is targeted.

The generation of the ILP constrains and objective using the scan architecture and test stimulus 36 and response 34 from FIG. 1, with two time instances (i.e., groups) per shift cycle, is explained. In this example, the scan architecture contains the four scan chains 12, 14, 16, 18, i.e. num_chains=4, and six cells per chain, i.e., n=6. Furthermore, the input stimulus 36 and response 34 bits in FIG. 1 are used to define the Sequence arrays as follows:

Sequence [0]=(0, 1, 0, 1, 0, 1, 0, 1, 0, 1, 0)
Sequence [1]=(0, 0, 1, 0, 1, 0, 1, 0, 0, 1, 0, 1)
Sequence [2]=(1, 1, 1, 0, 0, 0, 0, 0, 0, 1, 1, 1)
Sequence [3]=(0, 0, 0, 0, 0, 1, 1, 1, 1, 1, 1, 0), which produce the following Transition arrays:

Transition [0]=(1, 1, 1, 0, 1, 1, 1, 1, 1, 1, 1)
Transition [1]=(0, 1, 1, 1, 1, 1, 1, 0, 1, 1, 1)
Transition [2]=(0, 0, 1, 0, 0, 0, 0, 0, 1, 0, 0)
Transition [3]=(0, 0, 0, 0, 1, 0, 0, 0, 0, 0, 1).

Assuming that the weights, generally indicated with the number 38, for each of the scan cells 20, 22, 24, 26, 28, 30, are as shown in each of the scan chains 12, 14, 16, 18 in FIG. 1:

Scan Chain 12, Weight[0]=(20, 24, 18, 20, 15, 17)
Scan Chain 14, Weight[1]=(14, 22, 26, 18, 20, 20)
Scan Chain 16, Weight[2]=(18, 20, 19, 20, 22, 21)
Scan Chain 18, Weight[3]=(16, 14, 18, 15, 15, 17)
then, the Cycle arrays become:
Cycle[0]=(96, 94, 99, 97, 114, 114)
Cycle[1]=(100, 120, 106, 98, 94, 102)
Cycle[2]=(20, 22, 21, 18, 20, 19)
Cycle [3]=(14, 18, 15, 15, 17, 16)

The above arrays indicate that the peak power is equal to 254, which is the case for the second shift cycle. Next, the constraints are computed to ensure that each chain 12, 14, 16, 18 is assigned to only one of the two groups. The first set of constraints is:

$$p_{0,0} \leq 1, p_{1,0} \leq 1, p_{2,0} \leq 1, p_{3,0} \leq 1$$

$$p_{0,1} \leq 1, p_{1,1} \leq 1, p_{2,1} \leq 1, p_{3,1} \leq 1$$

$$\sum_{j=0}^{1} p_{0,j} = 1, \sum_{j=0}^{1} p_{1,j} = 1$$

$$\sum_{j=0}^{1} p_{2,j} = 1, \sum_{j=0}^{1} p_{3,j} = 1$$

while the second set of constraints is:

$$a_{0,0} = 96p_{0,0} + 100p_{1,0} + 20p_{2,0} + 14p_{3,0}$$

$$a_{0,1} = 96p_{0,1} + 100p_{1,1} + 20p_{2,1} + 14p_{3,1}$$

$$a_{1,0} = 94p_{0,0} + 120p_{1,0} + 22p_{2,0} + 18p_{3,0}$$

$$a_{1,1} = 94p_{0,1} + 120p_{1,1} + 22p_{2,1} + 18p_{3,1}$$

$$a_{2,0} = 99p_{0,0} + 106p_{1,0} + 21p_{2,0} + 15p_{3,0}$$

$$a_{0,1} = 99p_{0,0} + 106p_{1,1} + 28p_{2,0} + 15p_{3,0}$$

$$a_{3,0} = 97p_{0,0} + 98p_{1,0} + 18p_{2,0} + 15p_{3,0}$$

$$a_{3,1} = 97p_{0,1} + 98p_{1,1} + 18p_{2,1} + 15p_{3,1}$$

$$a_{4,0} = 114p_{0,0} + 94p_{1,0} + 20p_{2,0} + 17p_{3,0}$$

$$a_{4,1} = 114p_{0,1} + 98p_{1,1} + 18p_{2,1} + 15p_{3,1}$$

$$a_{5,0} = 114p_{0,0} + 102p_{1,0} + 19p_{2,0} + 16p_{3,0}$$

$$a_{5,1} = 114p_{0,1} + 102p_{1,1} + 19p_{2,1} + 16p_{3,1}$$

The last set of constraints introduces variable Peak, which represents the maximum number of transitions over the two time instants of all shift cycles, as follows:

$$a_{0,0} \leq \text{Peak}, a_{0,1} \leq \text{Peak}, a_{1,0} \leq \text{Peak}, a_{1,1} \leq \text{Peak},$$

$$a_{2,0} \leq \text{Peak}, a_{2,1} \leq \text{Peak}, a_{3,0} \leq \text{Peak}, a_{3,1} \leq \text{Peak},$$

$$a_{4,0} \leq \text{Peak}, a_{4,1} \leq \text{Peak}, a_{5,0} \leq \text{Peak}, a_{5,1} \leq \text{Peak},$$

and the optimization criterion is:

minimize Peak

One solution for this instance, wherein Peak is minimized to 138, is the following assignment:

$$p_{0,0} = p_{2,0} = 0, p_{1,0} = p_{3,0} = 1$$

$$p_{0,1} = p_{2,1} = 1, p_{1,1} = p_{3,1} = 1$$

which indicates that the peak power is reduced from 254 to 138, as dictated by $a_{1,1}$. The resulting assignment of chains 12, 14, 16, 18 to groups and the corresponding peak power during each time instant have been previously illustrated in FIG. 3.

While the ILP formulation presented enables DfT/CAD engineers to utilize efficient ILP-solvers and well-known approximation methods to obtain aggressive power reduction results, the computational run-time may be prohibitive for large size instances. For industrial-size designs, a computationally efficient greedy heuristic that is capable of partitioning scan chains to P different groups is presented hereinafter.

For each test pattern, the heuristic initially identifies the shift cycle that consumes the peak power. The computational complexity of this step is $O(\text{num\_chain} \times \text{depth}^2)$. Once these cycles are identified, the scan chains are sorted in a descending order in terms of the number of transitions in each chain in this cycle, resulting in a computational complexity of $O(\text{num\_chain} \times \log_2(\text{num\_chain}))$. Next, each chain, starting from the top of the sorted list, is assigned to one of the P groups so that the maximum number of transitions in all groups is minimized. The computational complexity of the above step is $O(P \times \text{num\_chain})$.

Finally, and once the partitioning phase is complete, the swapping of chains in different groups is performed in order to further reduce peak power. In this case, a chain is randomly selected from the partition that consumes the highest power (i.e. Peak partition) and is replaced with a randomly-selected chain from the partition that consumes the least power (i.e., Least partition). The swapping is repeated while peak power is being reduced, or a fixed number, m, of swapping attempts have been made without further reduction, to peak power, at which point the heuristic terminates. Since the depth of a scan architecture is usually larger than the number of chains, the complexity of the greedy heuristic, which is provided in Table 1, is $O(\text{num\_chain} \times \text{depth}^2)$.

TABLE 1

Greedy chain partitioning heuristic

Partition_Scan_Chains(Scan Stimulus and Response,m)
For every shift cycle (1 to depth)
   Compute the peak power;
Sort scan chains in descending order of their peak power
Repeat until all chains are partitioned
   If adding chain to partition i provides least peak power
     Add chain to partition i;
While peak power is being reduced, or m swapping
attempts have not been exceeded
   Select chain i and j from the Peak and Least groups
   If swapping chains i with j reduces peak power
     Swap chain i with j ;

The effectiveness of the proposed dynamic partitioning technique in reducing peak power observed during scan based testing can be evaluated. First, the peak power and run time of the ILP-based peak power minimization algorithm to that of the greedy heuristic is compared. Then, the peak power of the original scan architecture, the static partitioning method and the dynamic partitioning method using randomly generated stimulus and response data is analyzed and compared. Throughout this analysis, static partitioning refers to the assignment of the $i^{th}$ chain to the $(i \% P)^{th}$ partition statically for all test patterns. Finally, the effectiveness of the method is evaluated using complete test sets for the largest ISCAS89 benchmark circuits.

In the first set of experiments (in terms of peak power and run time using two groups), the two dynamic partitioning methods, namely, the ILP-solver and the greedy technique, are compared. A single pattern of scan stimulus and response bits is randomly generated with a certain probability that bits are set to a value of 1. The underlying scan architecture in this set of experiments consists of 20 scan chains (each with 50 scan cells), 50 scan chains (each with 100 scan cells), and 50 scan chains (each with 500 scan cells). The ILP solver and greedy heuristic are applied on this pattern to minimize its peak power. The results are provided in FIG. 6. Super columns in this FIG. 6 correspond to different probabilities that the scan stimulus and response bits are set to a value of 1. Each super column contains the minimized peak power that the proposed method delivers and the associated run time in seconds. This data is provided for both the ILP solver and the greedy heuristic.

In FIG. 6, it can be seen from the results that the peak power delivered by the greedy heuristic is always higher than the one delivered using the ILP solver, while the results are typically close. However, there is a significant gap between the run times. The greedy heuristic is considerably faster compared to the ILP solver. The run-time gap widens up as 1-bit probability and/or the scan architecture size is increased. In either case, the ILP solver has to deal with more variables. Actually, for the largest scan architecture, the ILP solver fails to halt within a reasonable amount of time, while the greedy heuristic delivers a solution within one second.

Figure 7:
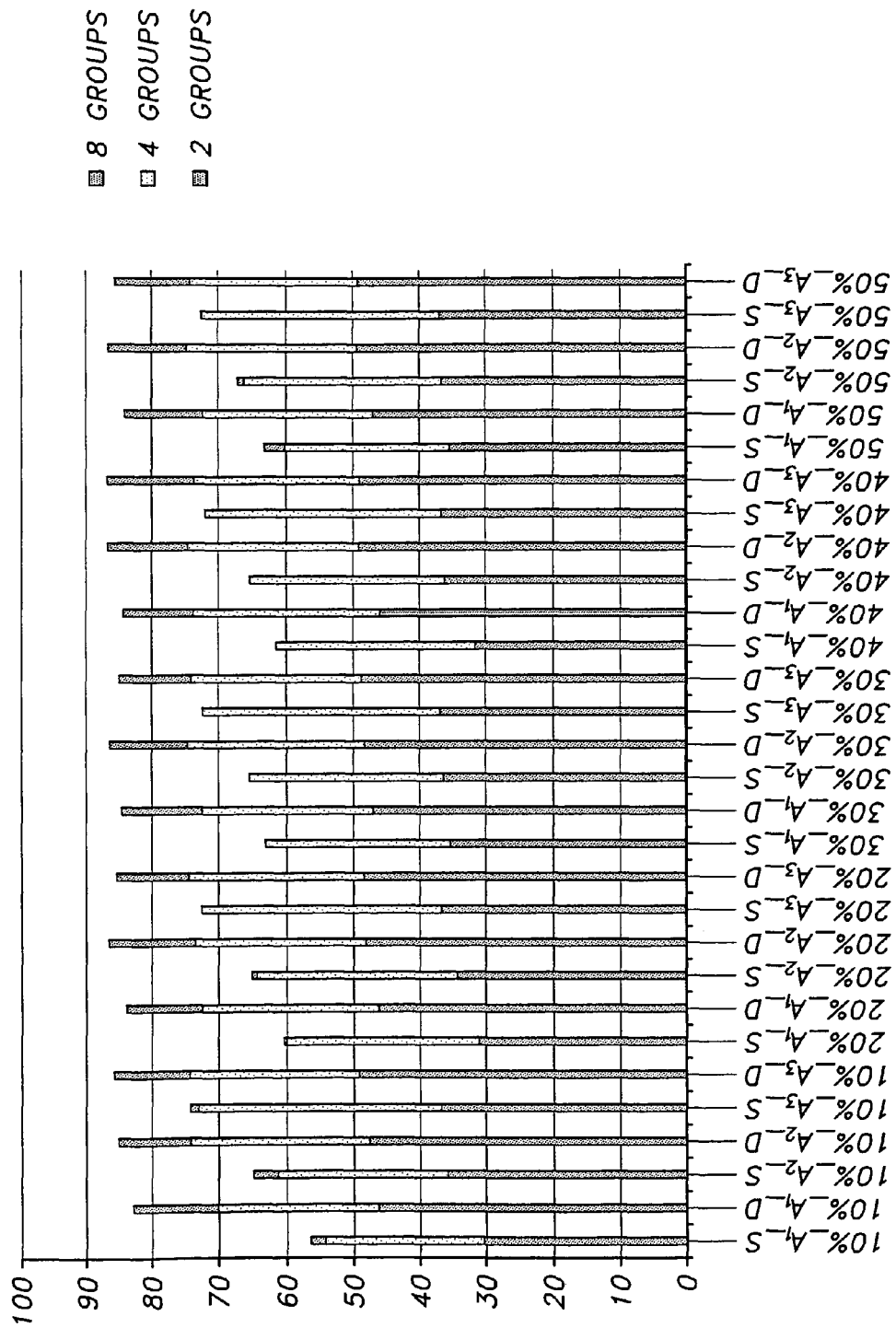
FIG. 7 is a chart showing peak power comparison with random test sets for two, four, and eight groups in a circuit providing dynamic scan chain partitioning according to the present invention.

Next, as shown in FIG. 7, the reduction in peak power of the proposed dynamic partitioning method (D) and that of the static partitioning method (S) over the original scan architecture, for two, four, and eight groups is provided. These results are provided for different probabilities of the scan stimulus and response bits being set to 1 (from 10% to 50%), and for three different scan architectures: 20 chains with 50 scan cells ($A_1$), 50 chains with 100 scan cells ($A_2$), and 50 chains with 500 scan cells ($A_3$). For a particular scan architecture and probability, the peak power is computed for 5000 randomly generated input patterns. In order to account for the existence of don't cares in test stimulus, a random set of scan chains that does not exceed half of the number of scan chains were repeat-filled with zeros.

The results in FIG. 7 illustrate that the proposed dynamic partitioning method delivers significant reduction in peak power over the original scan design and the static partitioning method. On average, the peak power of the original scan architecture is reduced by 48%, 74%, and 86%, which corresponds to an additional 20%, 28%, and 60% reduction over those of the static partitioning method for the three architectures.

Furthermore, the following observations can be drawn. First, the peak power reduction factor delivered by the proposed methodology is almost P, which is the number of groups, supporting the efficiency of the greedy heuristic in finding the scan chain groups that minimize peak power for a given number of groups. Second, although the proposed dynamic partitioning consistently outperforms static partitioning, the gap between the two techniques narrows down as the scan depth and/or the number of scan chains increases. Such a result is attributed to the uniformity of the distribution of transitions, wherein the test data is generated randomly. As the scan depth and/or the number of scan chains increases, the decision on how to partition the randomly filled scan chains results in a smaller reduction in peak power. Third, peak power results of the static partitioning method deteriorate, despite increasing the number of groups from four to eight.

Thus, the gap between the proposed dynamic method and the static partitioning method further widens up from a difference of 28% to a difference of 60% on the average. This clearly illustrates the limitations of the static partitioning method, which are accentuated by the assignment of few chains per partition in the lack of an accompanying judicious transition distribution analysis.

Figure 8:
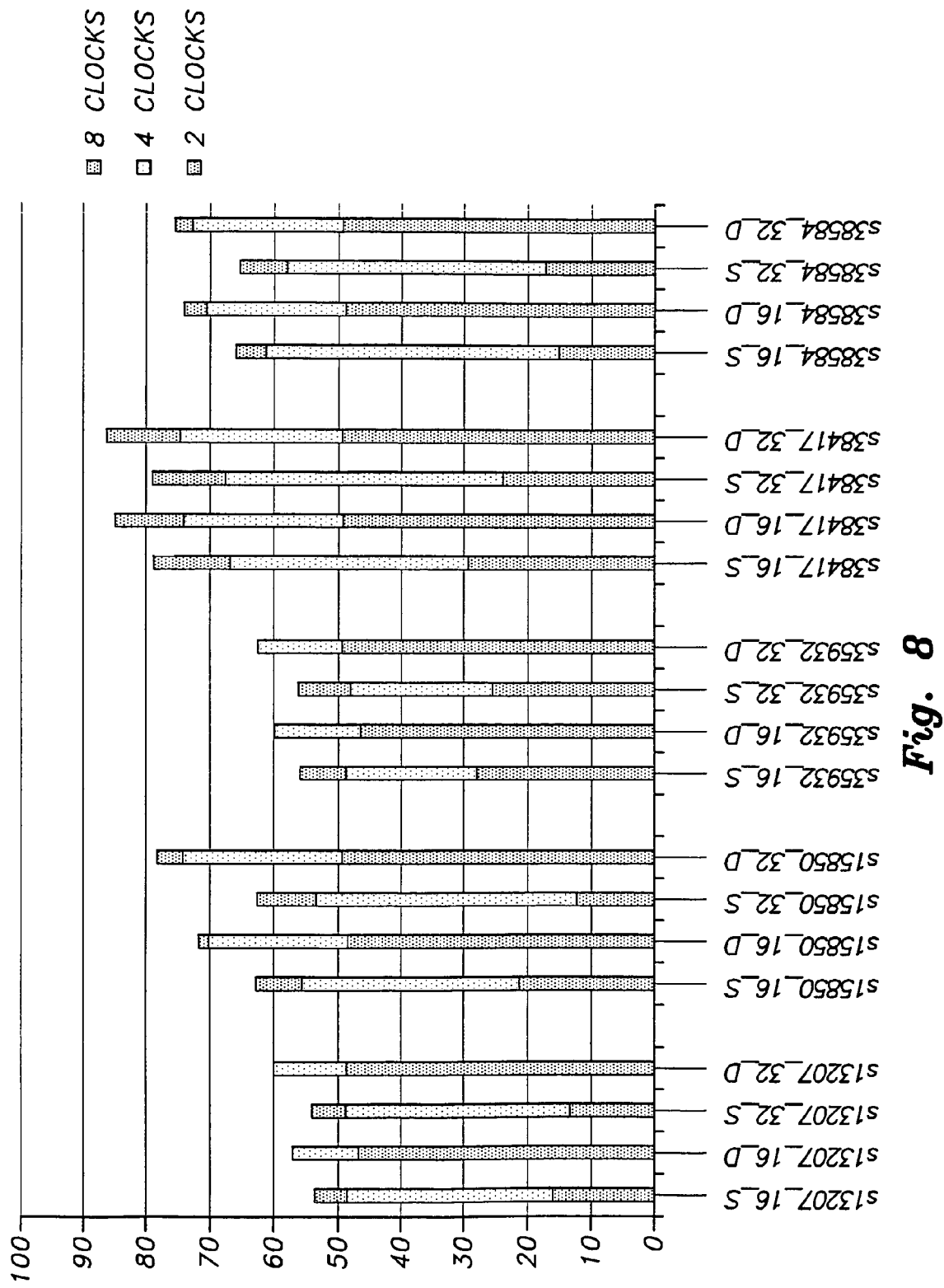
FIG. 8 is a chart illustrating peak power reduction results when testing ISCAS89 benchmark circuits and a method providing dynamic scan chain partitioning according to the present invention.

With reference now to FIG. 8, for ISCAS89 benchmark circuits, deterministic test sets with non-uniform transition distribution accentuate the effect of the decision on how to partition scan chains. In order to analyze the dynamic partitioning technique using deterministically generated test patterns, the method is applied on the largest ISCAS89 circuits with an underlying scan architecture of sixteen and thirty-two scan chains. FIG. 8 illustrates the peak power reduction of the static partitioning method and the proposed dynamic partitioning method over the original scan architecture. The test sets were produced using the test generation tool ATAL-ANTA, where "don't cares" in the input stimuli were replaced by zeros. The results that are summarized show that dynamic partitioning using two groups achieves a near-perfect 50% peak power reduction across all the benchmark circuits. Furthermore, for three of the five benchmark circuits, dynamic partitioning using four groups achieves a near-perfect 75% peak power reduction. This illustrates the efficiency of the greedy partitioning method in yielding groups with equal power consumption levels.

Additionally, on average, the dynamic partitioning method provides an additional peak power reduction over the static partitioning method by 36% using two groups, 27% using four groups, and a 23% using eight groups. As observed, the benefit of using dynamic over static partitioning reduces as the number of groups increases. This is attributed to the imbalance of the power consumption of different scan chains, as further explained in the next point.

For most benchmark circuits, using eight groups instead of four groups fails to deliver further significant peak power reductions, except for the static partitioning method. This is attributed to the imbalance between the weights of cells in different chains. For example, the peak power reduction for circuits s13207 and s35932 is less than 60% using eight groups, as opposed to the theoretically attainable factor of 8× reduction (i.e., 87.5%). Upon further investigation of these circuits, it can be observed that a few scan cells in a single scan chain fan out to many gates in the circuit, which increases the dominance of that scan chain in the power consumption in the circuit. Thus, the clock instance where this chain is allocated will dominate the power consumption. Finally, with an increase of the number of groups from four to eight, a single scan chain dominates power consumption, which limits the ability of the dynamic partitioning method from reaping further peak power reductions.

On the other hand, static partitioning with an initial set of four groups reduces peak power, as these sets are further divided into eight, which naturally reduces peak power incurred by randomly-generated groups. The proposed dynamic partitioning method with two groups and the static partitioning approach with four groups provide similar peak power reduction levels. In such cases, using the dynamic partitioning method with fewer groups presents a more cost-effective yet equal-quality alternative, compared to static partitioning with more groups. The percentile peak power reduction of the proposed method is only marginally enhanced as the number of chains is increased (i.e., sixteen chains versus thirty-two chains).

Finally, incorporating the dynamic partitioning technique requires the utilization of the reconfigurable partitioning hardware, as illustrated in FIG. 9. The cost of the original circuit with sixteen scan chains is the base case. Area cost of the base case includes the scan overhead. The area overhead results, which are measured by the gate count, namely, gate count multiplied by the average fan-in, are computed as a percentage with respect to the base case. The area overhead for incorporating the dynamic partitioning method in the ISCAS circuits in FIG. 9 can be seen to depend upon the number of groups and the size of the original circuit. For smaller circuits, the area cost is more significant, while in larger circuits the cost becomes easily tolerable. Even with eight groups, the area cost is around 4% for the larger circuits, boding well for the practicality of the approach for industrial designs.

In conclusion, a peak power reduction technique has been shown that is based on the dynamic partitioning of the scan chains into multiple groups. The partitioning ensures that the toggling of each of the scan chain groups, and thus the corresponding clock network and combinational logic, is evenly distributed over multiple time instants within every shift cycle. All the contributors of peak power are thus reduced.

Furthermore, scan chain partitioning is effected on a per pattern basis in order to evenly distribute scan chain transitions into multiple groups for every test pattern. The reconfigurable on-chip hardware is capable of realizing any possible partitioning of the scan chains into multiple groups. Such a capability reflects into maximal adaptiveness to the transition distribution of any test pattern, which static partitioning techniques fail to deliver. The fact that the method and apparatus are test set independent and yet capable of handling any given test set delivers a practical and effective solution.

The noted results also justify that the technique is capable of reaching close to the theoretical best reductions and of outperforming the other static partitioning techniques, while it has a small area cost. Furthermore, the technique incurs no test time penalty for the cases where scan chains are partitioned into two groups, and only slight prolongation in test time for scan chain partitioning beyond two groups.

It is to be understood that the present invention is not limited to the embodiment described above, but encompasses any and all embodiments within the scope of the following claims.

We claim:

1. A circuit providing dynamic scan chain partitioning, comprising:
    a partitioning block circuit adapted for insertion into a scan chain architecture, the scan chain architecture having a plurality of scan chains, each of the scan chains having a scan chain clock; the partitioning block circuit being configured for manipulating the scan chain clocks feeding the scan chains and being configured for dynamically partitioning the scan chains into groups to minimize peak power, wherein the partitioning block circuit comprises:
        a partition register containing a plurality of flip-flops for each of the scan chains;
        a clock generator block circuit for generating a clock signal feeding the partition register;
        a plurality of AND gates connected to the flip-flops; and
        a plurality of multiplexers connected to the plurality of AND gates, the plurality of multiplexers selecting one of the clock signals as the clock signal for the corresponding scan chain, each of the clock signals having a delay adjusted to stagger clock edges within a shift cycle.

2. The circuit providing dynamic scan chain partitioning according to claim 1, wherein toggling of the clock signals is constrained within the partitioning block only, whereby partition register load operations consume negligible power.

3. The circuit providing dynamic scan chain partitioning according to claim 2, wherein load operations during a capture window are applied at a faster frequency, the partition register having a content preserved throughout shift cycles until a next subsequent capture window.

4. The circuit providing dynamic scan chain partitioning according to claim 3, wherein the AND gates control the multiplexers during a functional mode.

5. The circuit providing dynamic scan chain partitioning according to claim 4, wherein the multiplexers are forced to select an original clock signal, all of the functional flip-flops in the partition register receiving an identical clock signal during the functional mode and during the capture window.

6. The circuit of providing dynamic scan chain partitioning according to claim 5, wherein the partition register dictates whether the clock signal is selected.

7. The circuit of providing dynamic scan chain partitioning according to claim 6, wherein the partition register dictates whether a delayed clock signal is selected.

8. A method of providing dynamic scan chain partitioning, comprising the steps of:
    defining a sequence of input stimulus and response bits for a scan chain by Sequence $[c]=(s_0^c, s_1^c, \ldots, s_{2n-1}^c)$, where $0 \leq c < \text{num\_chains}$, wherein n represents a depth of the longest chain, num_chains represents a number of scan chains, and $S_i^j$ the $i^{th}$ stimulus or response bit value in the $j^{th}$ chain;
    minimizing a maximum number of transitions for a given shift cycle, the transitions being defined in a given shift cycle as Transition $[c]=(t_0^c, t_1^c, \ldots, t_{2n-2}^c)$, where $t_i^c = s_i^c \oplus s_{i+1}^c$, Transition[i] is a 1-dimensional binary array representing the transitions that will ripple through chain i for a test pattern;
    assigning a weight for a cell corresponding to a total number of gates driven by the cell, wherein Weight $[c]=(w_0^c, w_1^c, \ldots, w_{n-1}^c)$ and where $w_i^c$ is the total number of gates driven by scan cell i in chain c; and
    defining the total number of transitions for each of the chains during every shift cycle as $$\text{Cycle}[c] = \left( \sum_{i=0}^{n-1} w_i^c t_i^c, \sum_{i=1}^{n} w_{i-1}^c t_i^c, \ldots, \sum_{i=n-1}^{2n-2} w_{i-(n-1)}^c t_i^c \right),$$

where Cycle[i] is a 1-dimensional array representing the number of transitions occurring in the chain i for every shift cycle.

9. The method of providing dynamic scan chain partitioning according to claim 8, further comprising the step of assigning the chain to one and only one P groups, where P is the number of time instances during the shift cycle, which is modeled by a first set of constraints $p_{c,j} \leq 1$ and $$\sum_{j=0}^{P-1} p_{c,j} = 1,$$

where $p_{c,j}$ is a binary variable having a value of 1 if chain c is included in partition j, j<P.

10. The method of providing dynamic scan chain partitioning according to claim 9, further comprising the step of defining variables $a_{\alpha,j}$, representing a count of transitions in all chains during time instant j of shift cycle, $\alpha$, as $$a_{\alpha,j} = \sum_{c=0}^{num\_chains-1} p_{c,j} \times \text{Cycle}[c][\alpha]$$

where $0 \leqq \alpha < n$.

11. The method of providing dynamic scan chain partitioning according to claim 10, further comprising the step of defining a variable Peak, representing a maximum number of transitions in the P groups during all time instants for all shift cycles, where $a_{\alpha,j} \leqq \text{Peak}$ and where $0 \leqq j < P$.

12. The method of providing dynamic scan chain partitioning according to claim 11, further comprising the step of defining an optimization criterion defined as minimize Peak, wherein minimization of peak power over all time instants in all shift cycles is targeted.

* * * * *